United States Patent
Niu et al.

(10) Patent No.: US 12,170,271 B2
(45) Date of Patent: Dec. 17, 2024

(54) EMBEDDED OPTICAL SENSORS IN A MICRO-LED DISPLAY

(71) Applicant: Apple Inc., Cupertino, CA (US)

(72) Inventors: Xiaofan Niu, San Jose, CA (US); Sunggu Kang, San Jose, CA (US); Mohammad Yeke Yazdandoost, Santa Clara, CA (US); Giovanni Gozzini, Berkeley, CA (US); Xia Li, San Jose, CA (US); Oray O. Cellek, Los Altos, CA (US); Sandeep Chalasani, San Jose, CA (US); Steven E. Molesa, San Jose, CA (US); Jaein Choi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 565 days.

(21) Appl. No.: 17/398,952

(22) Filed: Aug. 10, 2021

(65) Prior Publication Data

US 2022/0068900 A1   Mar. 3, 2022

Related U.S. Application Data

(60) Provisional application No. 63/073,885, filed on Sep. 2, 2020.

(51) Int. Cl.
*H01L 25/16* (2023.01)
*G09G 3/32* (2016.01)

(52) U.S. Cl.
CPC ............. *H01L 25/167* (2013.01); *G09G 3/32* (2013.01); *G09G 2300/0452* (2013.01); *G09G 2360/144* (2013.01)

(58) Field of Classification Search
None
See application file for complete search history.

(56) References Cited

U.S. PATENT DOCUMENTS

| | | | | |
|---|---|---|---|---|
| 11,532,676 B2* | 12/2022 | Yuan | ................... | G06V 40/1318 |
| 11,687,182 B2* | 6/2023 | Tsao | ................... | G06F 3/0416 |
| | | | | 345/173 |
| 11,716,892 B2* | 8/2023 | Park | ...................... | H10K 59/65 |
| 11,721,124 B2* | 8/2023 | Lee | ...................... | H10K 59/131 |
| | | | | 382/124 |
| 2022/0129100 A1* | 4/2022 | Tsao | ...................... | G06F 3/0416 |
| 2023/0269457 A1* | 8/2023 | Nishide | .................. | H05B 33/14 |
| | | | | 348/370 |

* cited by examiner

*Primary Examiner* — Long Pham
(74) *Attorney, Agent, or Firm* — BAKERHOSTETLER

(57) ABSTRACT

A micro-light-emitting diode (LED) display includes a number of micro-LED pixel elements and multiple optical sensors integrated with the micro-LED pixel elements. A transparent conductor layer is disposed over the micro-LED pixel elements and optical sensors.

21 Claims, 15 Drawing Sheets

| APPLICATION | | GOALS | WAVELENGTH OF OPERATION | POTENTIAL ADDITIONS TO DISPLAY |
|---|---|---|---|---|
| AMBIENT LIGHT SENSING | | • INTEGRATED AMBIENT LIGHT SENSOR IN THE MICRO-LED DISPLAY | VISIBLE RANGE | PHOTODETECTOR |
| TOUCH SENSING | | • INTEGRATED OPTICAL TOUCH SENSING IN A MICRO-LED DISPLAY<br>• INTEGRATED OPTICAL GESTURE AND HOVER SENSING IN THE OLED DISPLAY<br>• POTENTIALLY WATER TOLERANT TOUCH | VISIBLE OR NIR | PHOTODETECTOR (+NIR ILLUMINATOR) |
| HOVER | | • INTEGRATED HOVER SENSING IN A MICRO-LED DISPLAY | NIR | PHOTODETECTOR (+NIR ILLUMINATOR) |
| PROXIMITY | | • USING MULTIPLE DETECTORS AND ILLUMINATORS TO IMPLEMENT PROXIMITY AND HAVE DIRECTIONALITY | NIR | PHOTODETECTOR (+NIR ILLUMINATOR) |
| FINGERPRINT SENSING | | • FINGERPRINT SENSING INTEGRATED IN THE MICRO-LED DISPLAY | BLUE AND GREEN | PHOTODETECTOR + COLLIMATOR |
| HEALTH SENSING | | • VEIN IMAGING (POTENTIALLY CAN BE USED AS BIOMETRIC SENSOR)<br>• HEART RATE SENSING<br>• BLOOD OXYGEN LEVEL<br>• THERMOMETER | NIR AND OR VISIBLE | PHOTODETECTOR (+NIR ILLUMINATOR) |
| IMAGING | | • RGB OR SPECIAL WAVELENGTH IMAGING (E.G. CONTACT IMAGING AND ETC.) | VISIBLE AND NIR | PHOTODETECTOR |

*FIG. 5A*

EMBEDDED OPTICAL SENSORS IN A MICRO-LED DISPLAY

CROSS-REFERENCE TO RELATED APPLICATION

This application claims the benefit of U.S. Provisional Application No. 63/073,885, entitled "EMBEDDED OPTICAL SENSORS IN A MICRO-LED DISPLAY," filed Sep. 2, 2020, the entirety of which is incorporated herein by reference.

TECHNICAL FIELD

The present description relates generally to sensor technology, and more particularly to embedded optical sensors in a micro-light-emitting diode (micro-LED) display.

BACKGROUND

Micro-light-emitting diode (micro-LED) is a technology used in displays consisting of an array of microscopic LEDs of different colors, such as red, green and blue. Competing with organic-LED (OLED) and quantum-dot LED (QLED) display technology, micro-LED is considered by some to be the superior technology, which have used in a super large (e.g., 146-inch) micro-LED television (TV) prototype. Similar to OLED, micro-LED is an emissive display technology where the picture elements, also known as pixels, are also the light source. This means emissive display technologies don't require a separate backlight layer, which allows displays to be thinner than liquid-crystal display (LCD). Unlike OLED, micro-LED doesn't require an encapsulation layer making it even thinner. QLED is not an emissive display type as LEDs are only used to light quantum dots. Both OLED and micro-LED have fast response times.

Unlike OLEDs, micro-LEDs are not made with organic compounds, but with the more traditional indium gallium nitride (InGaN)-based LEDs that have been shrunk down. The use of InGaN LEDs results in micro-LED displays having greater brightness without degradation and burn-in, which is possible on OLED and an upside of QLED displays. While LED-backlit displays, commonly referred to as LED displays, can do regional dimming of LEDs for better contrast, they don't have the inherent high contrast or response time of the true emissive display technologies such as OLED and micro-LED.

BRIEF DESCRIPTION OF THE DRAWINGS

Certain features of the subject technology are set forth in the appended claims. However, for purposes of explanation, several embodiments of the subject technology are set forth in the following figures.

FIGS. 5A and 5B are a table and a chart, respectively, illustrating examples of applications of optical-sensor-embedded micro-LED displays, in accordance with one or more aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology.

The subject technology is directed to a micro-light-emitting diode (LED) display with embedded optical sensors. In some aspects, the embedded optical sensors of the subject technology can be embedded on the micro-LED panel at the same plane with the red-green-blue (RGB) pixels. In other aspects of the subject technology, the embedded optical sensors can be integrated inside the micro-LED panel at the same plane with micro-drivers or underneath the micro-LED panel.

The optical-sensor-embedded micro-LED display of the subject technology can be used in a number of applications, such as ambient light sensing (ALS), fingerprint sensing, and proximity sensing. In some implementations, micro- LED chips under reverse bias or silicon-based p-i-n semiconductor (PIN) photodetectors can be used to realize the embedded optical sensors of the subject technology. In one or more implementations, the embedded optical sensors can be based on an organic photodetector (OPD), a dedicated silicon-based photodetector, a quantum-dot (QD) or quantum film (QF)-based optical sensor.

The spectral response wavelengths of the embedded optical sensors of the subject technology depends on the material used and can cover visible, near infra-red (IR) and short-wave IR (SWIR), especially when QD is used. The embedded optical sensors can be read out using different read-out circuits such as 3T-pixel, direct injection pixel or current trans-impedance amplifier (CTIA) read-out circuits. Embedded light collimators can be achieved by adding additional black matrix (BM) layers or using one or more QD focusing layers across the display, as discussed in more detail herein.

Figure 1:
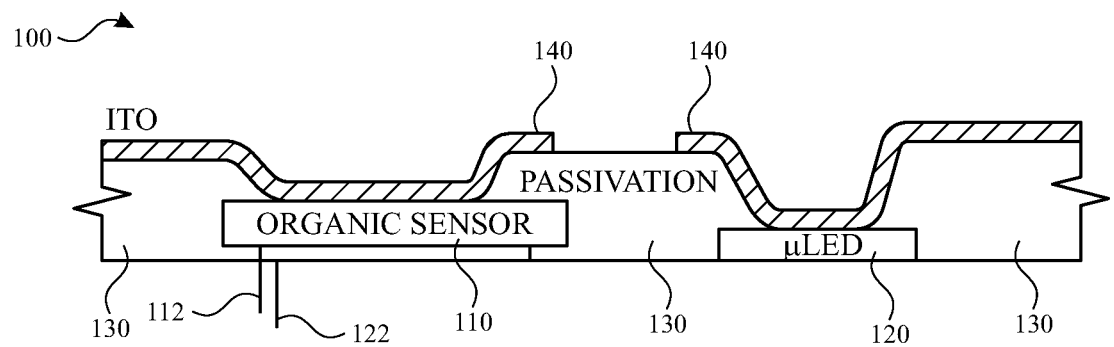
FIG. 1 is a schematic diagram illustrating a cross-sectional view of a section of an exemplary micro-light-emitting diode (micro-LED) display with embedded optical sensor, in accordance with one or more aspects of the subject technology.

FIG. 1 is a schematic diagram illustrating a cross-sectional view of a section of an exemplary micro-LED display 100 with an embedded optical sensor, in accordance with one or more aspects of the subject technology. The cross-sectional view of the section of the micro-LED display 100 shown in FIG. 1 includes an organic sensor 110, a micro-LED 120, a passivation layer 130 and a transparent conductive layer 140 and the wires 112 and 122. The organic sensor 110 is integrated with the micro-LED 120 on a substrate and is isolated from the micro-LED 120 using the passivation layer 130. The transparent conductive layer 140 can be an indium-tin oxide (ITO) layer that provides contact for the micro-LED 120 and the organic sensor 110. The wires 112 and 122 are driver terminals of the organic sensor 110 and the micro-LED 120, respectively, which can be realized by conductive traces.

Figure 2:
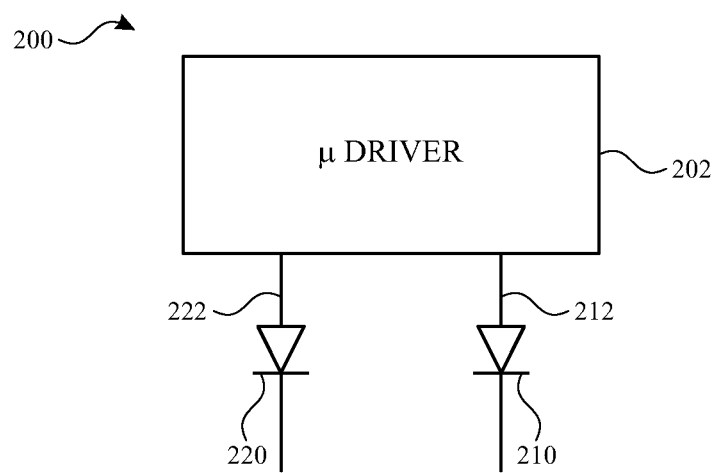
FIG. 2 is a schematic diagram illustrating a shared driver of a micro-LED and an embedded optical sensor of a micro-LED display, in accordance with one or more aspects of the subject technology.

FIG. 2 is a schematic diagram illustrating a shared driver circuit 202 of a micro-LED 220 and an embedded optical sensor 210 of a micro-LED display, in accordance with one or more aspects of the subject technology. An advantageous feature of the subject technology is that a single micro-driver, such as the shared driver circuit 202 (hereinafter, driver 202), can be used to drive the current of both the embedded optical sensor 210 and the micro-LED 220. In some aspects, the driver 202 can be a passive or active matrix driver that can drive an array of micro-LEDs and optical sensors of a display. The embedded optical sensor 210 and the micro-LED 220 are coupled to the driver 202 via conductors 212 and 222, which are the same as the wires 112 and 122 of FIG. 1. In some aspects, the micro-LED 220 (e.g., a red micro-LED) can be reverse biased and used as a photodetector.

Figure 3A:
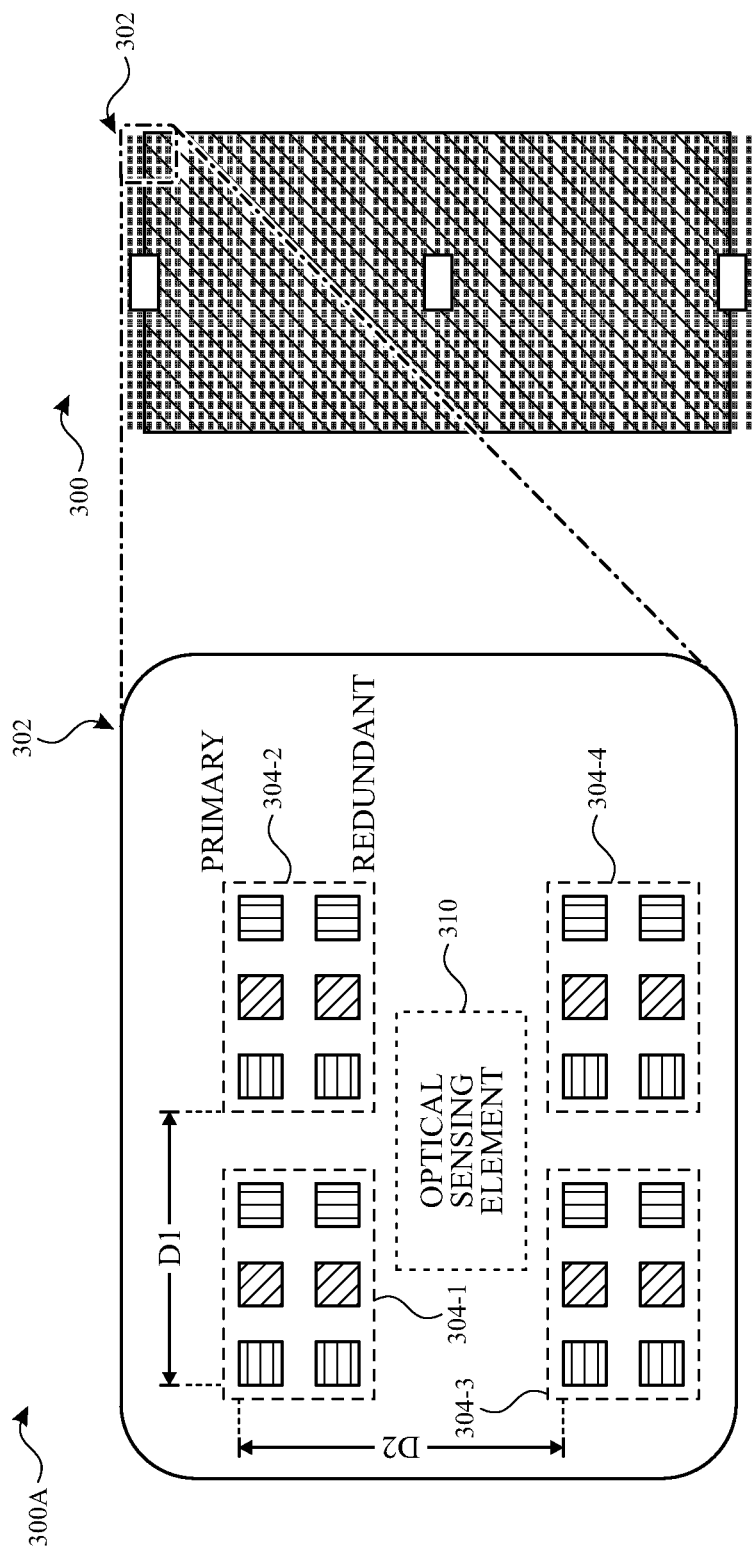
FIGS. 3A, 3B and 3C are diagrams illustrating various example configurations for embedding optical sensors within a micro-LED display, in accordance with one or more aspects of the subject technology.
Figure 3B:
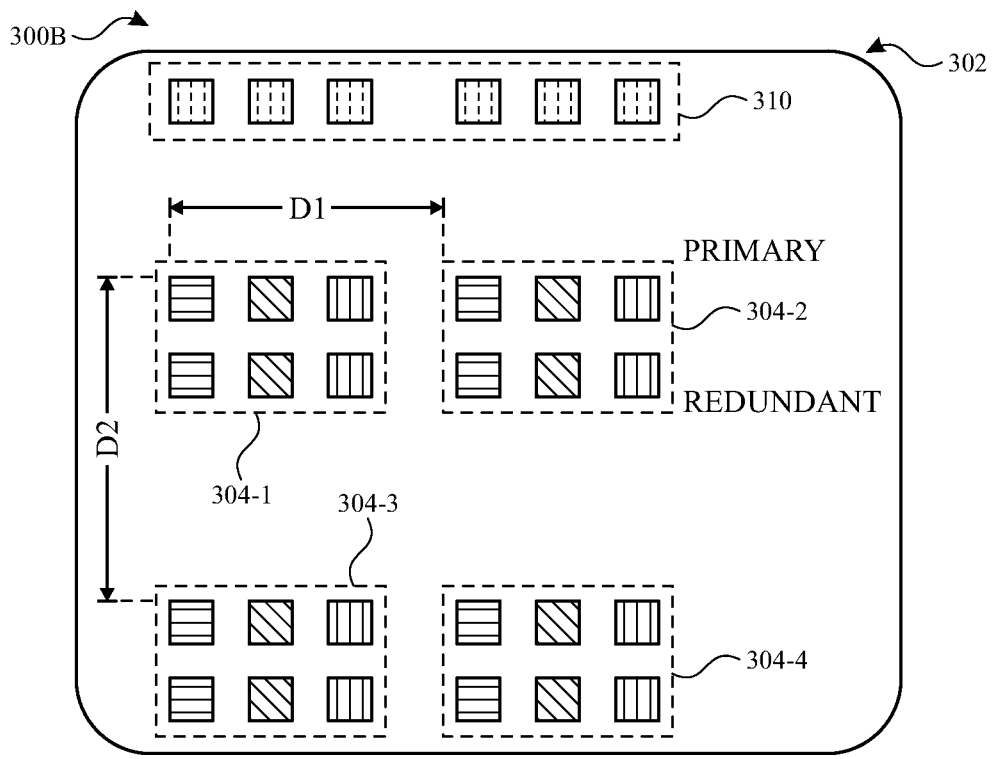
Figure 3C:
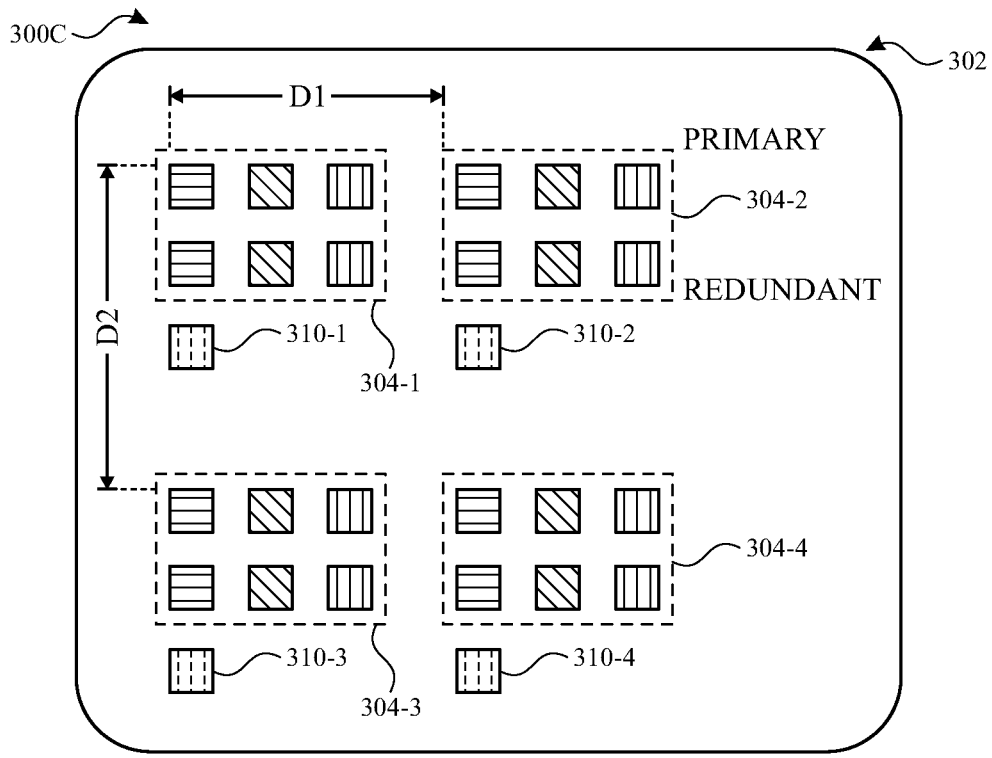

FIGS. 3A, 3B and 3C are diagrams illustrating various example configurations 300A, 300B and 300C for embedding optical sensors within a micro-LED display, in accordance with one or more aspects of the subject technology. The configuration 300A of FIG. 3A represents a portion 302 of a display 300. In the configuration 300A, one or more optical sensing elements 310 are located in an area surrounded by four RGB pixel blocks 304 (304-1, 304-2, 304-3 and 304-4) of the micro-LED display. Each RGB pixel block 304 includes a primary set and a redundant set of RGB pixels that are not in use. In some implementations, the dimensions d1 and d2 shown in FIG. 3A are about 78 µm.

The configuration 300B of FIG. 3B represents a portion 302 of the display 300 of FIG. 3A. In the configuration 300B, an array 310 of optical sensing elements is located in an area above the four RGB pixel blocks 304 (304-1, 304-2, 304-3 and 304-4) of the micro-LED display. Each RGB pixel block 302 includes a primary set and a redundant set of RGB pixels. In some implementations, the dimensions d1 and d2 shown in FIG. 3B are about 78 µm.

The configuration 300C of FIG. 3C represents a portion 302 of the display 300 of FIG. 3A. In the configuration 300C, the sensing elements 310 (310-1, 310-2, 310-3 and 310-4) are staggered in areas adjacent to the four RGB pixel blocks 304 (304-1, 304-2, 304-3 and 304-4) of the micro-LED display. Each RGB pixel block 304 includes a primary set and a redundant set of RGB pixels.

Figure 4A:
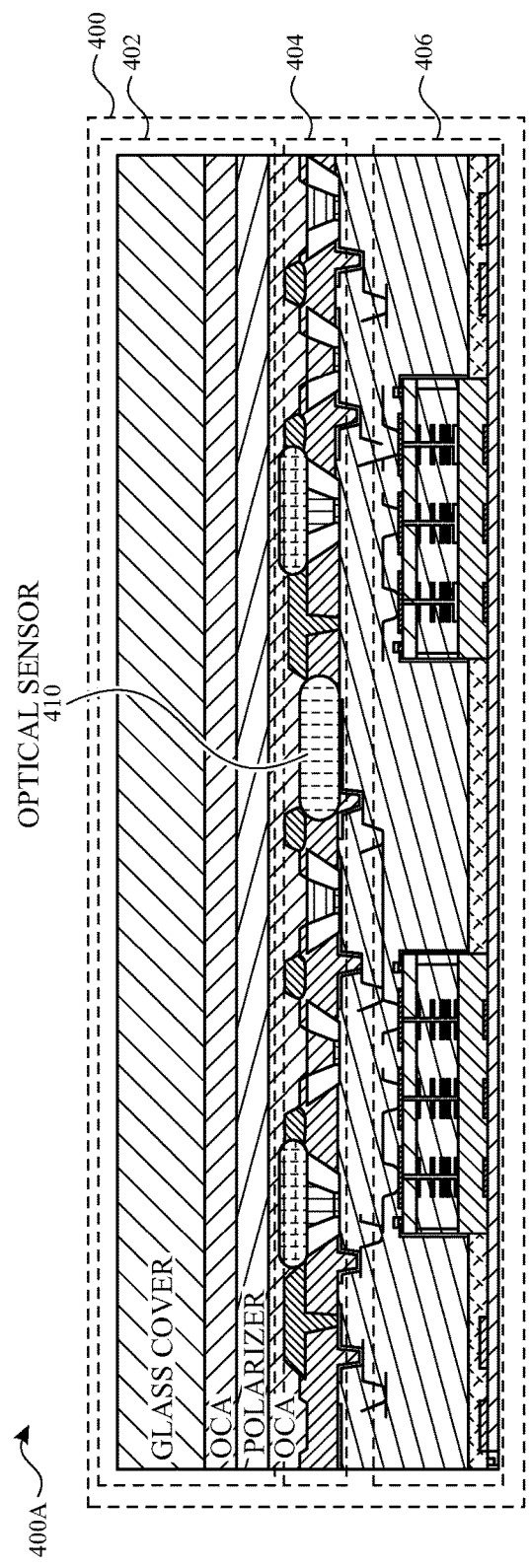
FIGS. 4A, 4B and 4C are diagrams illustrating example schemes with various locations for embedding optical sensors within a micro-LED display, in accordance with one or more aspects of the subject technology.
Figure 4B:
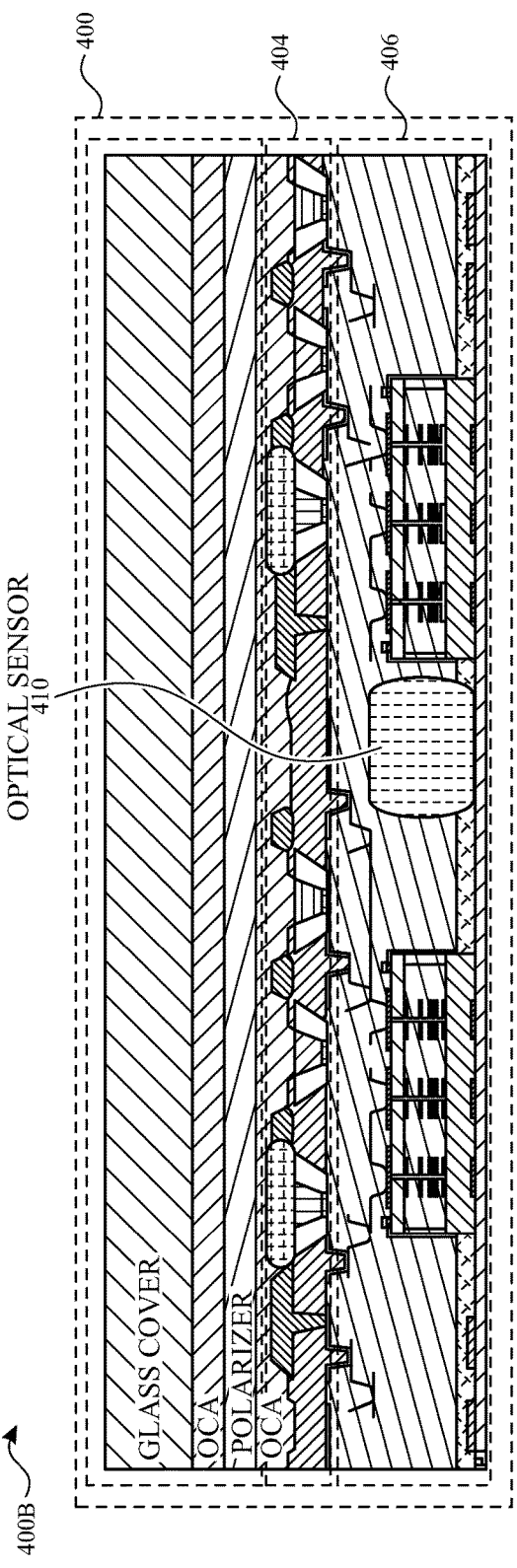
Figure 4C:
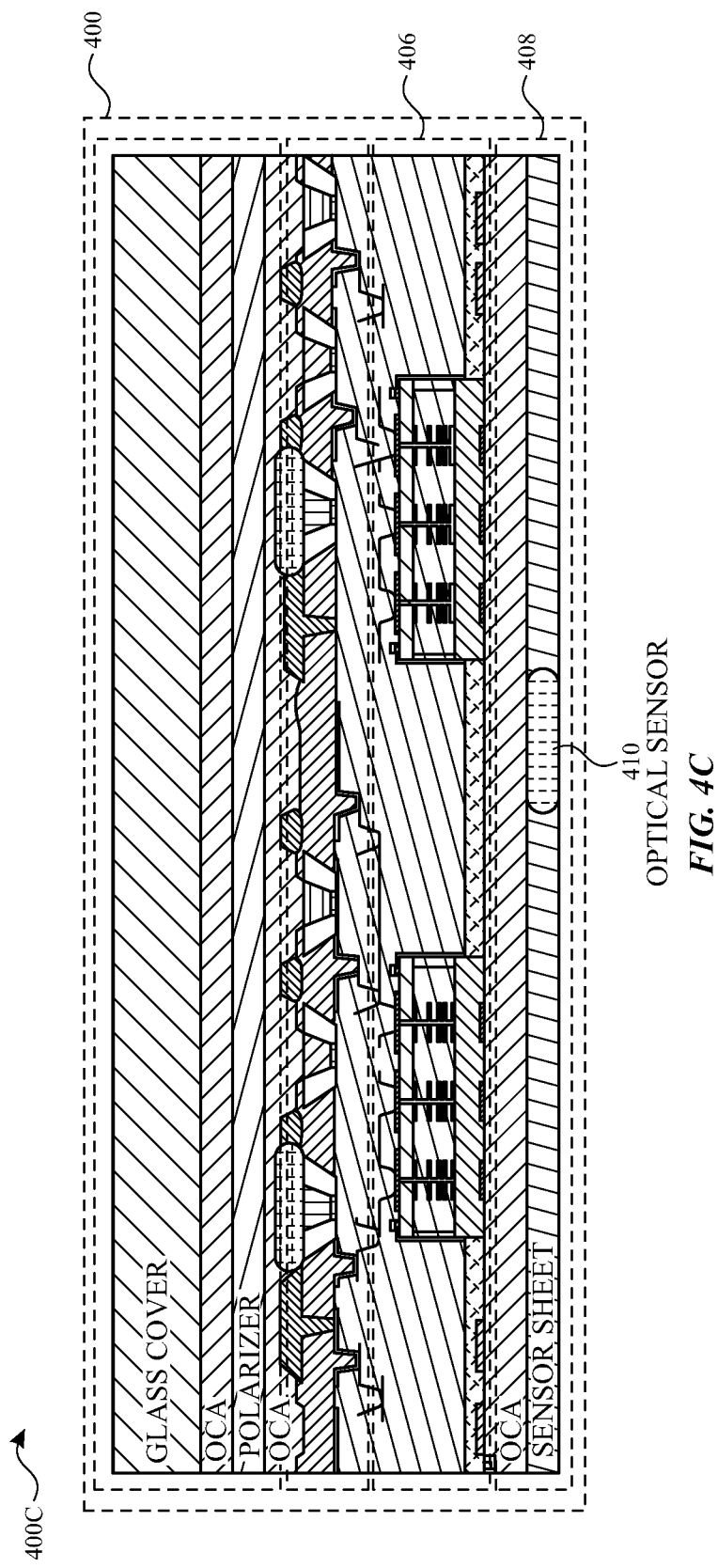

FIGS. 4A, 4B and 4C are diagrams illustrating example schemes 400A, 400B and 400C with various locations for embedding optical sensors 410 within a micro-LED display 400, in accordance with one or more aspects of the subject technology. The micro-LED display 400 includes a display panel 402, a micro-LED panel 404 and a micro-driver layer 406. The display panel 402 includes a cover glass attached to a polarizer layer through an optically clear adhesive (OCA) layer. The display panel 402 is coupled to the micro-LED panel 404 via a layer of OCA. The micro-LED panel 404 is disposed on the micro-driver layer 406 and includes an array of RGB pixel blocks similar to the RGB pixel blocks 304 of FIG. 3.

In the scheme 400A of FIG. 4A, the optical sensors 410 are embedded in the micro-LED panel 404 at the same plane with the RGB pixels. The distribution of the optical sensors 410 within the micro-LED panel 404 can be based on configurations 300A, 300B and 300C of FIGS. 3A, 3B and 3C, respectively, but is not limited to these configurations and can be based on other configurations. In the scheme 400A, less electrical shielding and a desired optical transmission (e.g., 32%) can be achieved by avoiding metal traces and BM obstruction. In the scheme 400A, an example value for the height of the optical sensors 410 is about 3.5 µm.

In the scheme 400B of FIG. 4B, the optical sensors 410 are embedded in the micro-driver layer 406 underneath the plane of the RGB pixels. The distribution of the optical sensors 410 within the micro-driver layer 406 can be based on available free spaces in between the micro-drivers. The scheme 400B may not provide the advantageous features of the scheme 400A, with regard to the electrical shielding and optical transmission. In the scheme 400A, an example value for the height of the optical sensors 410 can be about 8.5 µm.

In the scheme 400C of FIG. 4C, the optical sensors 410 are embedded in a layer 408 underneath the micro-driver layer 406. The scheme 400C may provide the same or lower electrical and optical transmission compared to the scheme 400B. Although the scheme 400C results in increased height of the micro-LED display 400, there is no limitation for the height of the optical sensors 410.

Figure 5B:
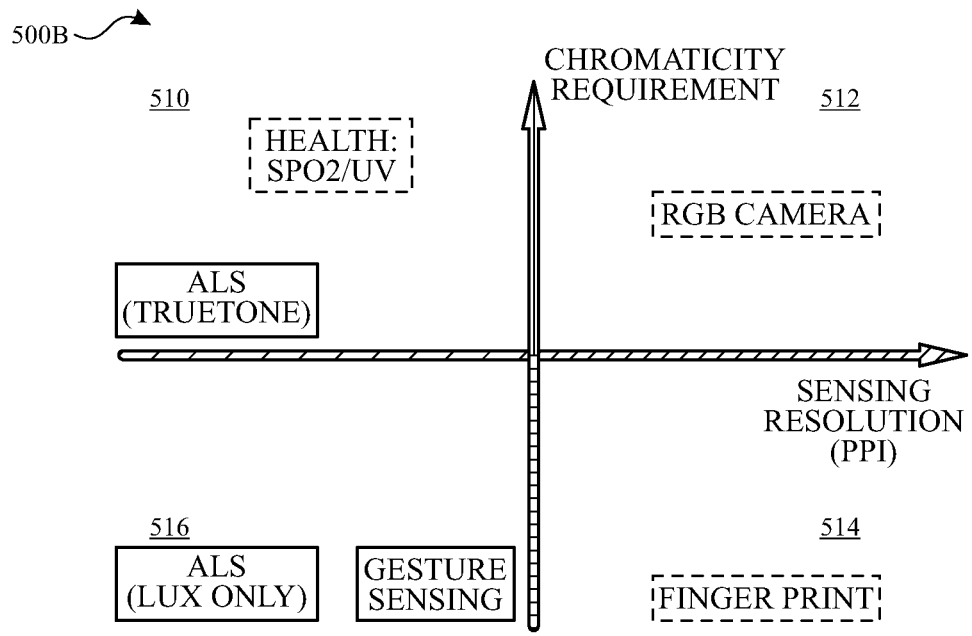

FIGS. 5A and 5B are a table 500A and a chart 500B, respectively, illustrating examples of applications of optical-sensor-embedded micro-LED displays, in accordance with one or more aspects of the subject technology. The table 500A of FIG. 5A includes an application column 502, a goals column 504, a wavelength column 506 and a column 508 specifying the potential additions to the display. The application column 502 shows various applications of the optical-sensor-embedded micro-LED display of the subject technology, including ambient light sensing, touch sensing, hover sensing, proximity sensing, fingerprint sensing, health sensing, and imaging. The achievable goals for each application are described in the corresponding row of that application. The wavelength column 506 specifies the corresponding wavelength of operation for each application.

Finally, the column 508 shows the potential additions, such as photodetectors with various characteristics to the display device.

The chart 500B of FIG. 5B illustrates different applications of the optical-sensor-embedded micro-LED display of the subject technology in four regions of a two-dimensional space. The two dimensions are the chromaticity requirement for each application and the required sensing resolution for that application. The chart 500B is self-explanatory.

Figure 6A:
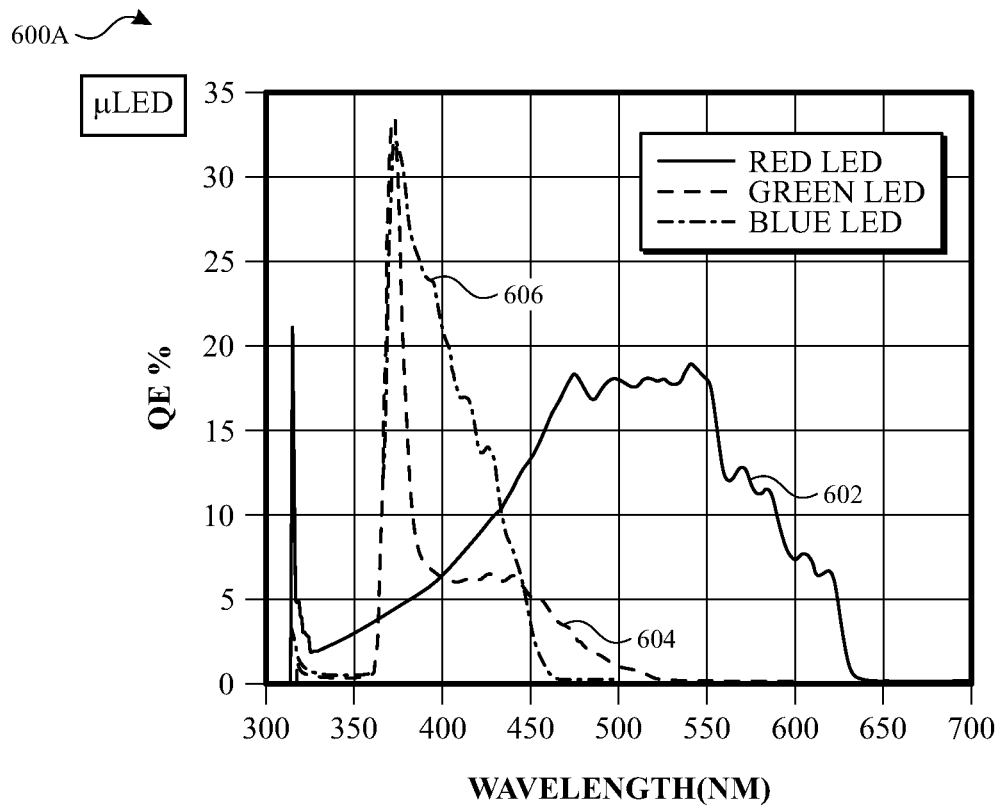
FIGS. 6A, 6B and 6C are charts illustrating optical characteristics of example material choices for optical sensors of an optical-sensor-embedded micro-LED display, in accordance with one or more aspects of the subject technology.
Figure 6B:
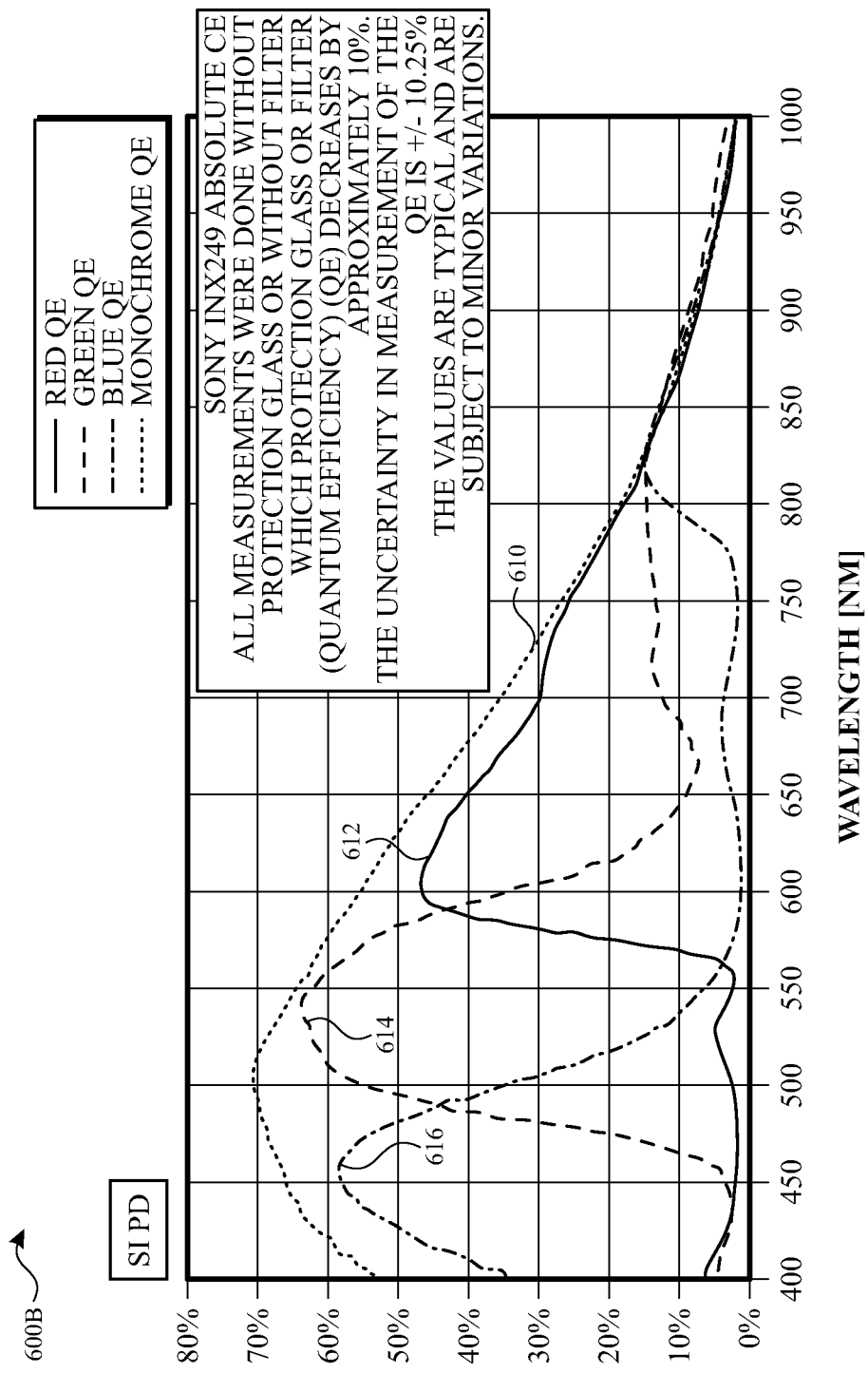
Figure 6C:
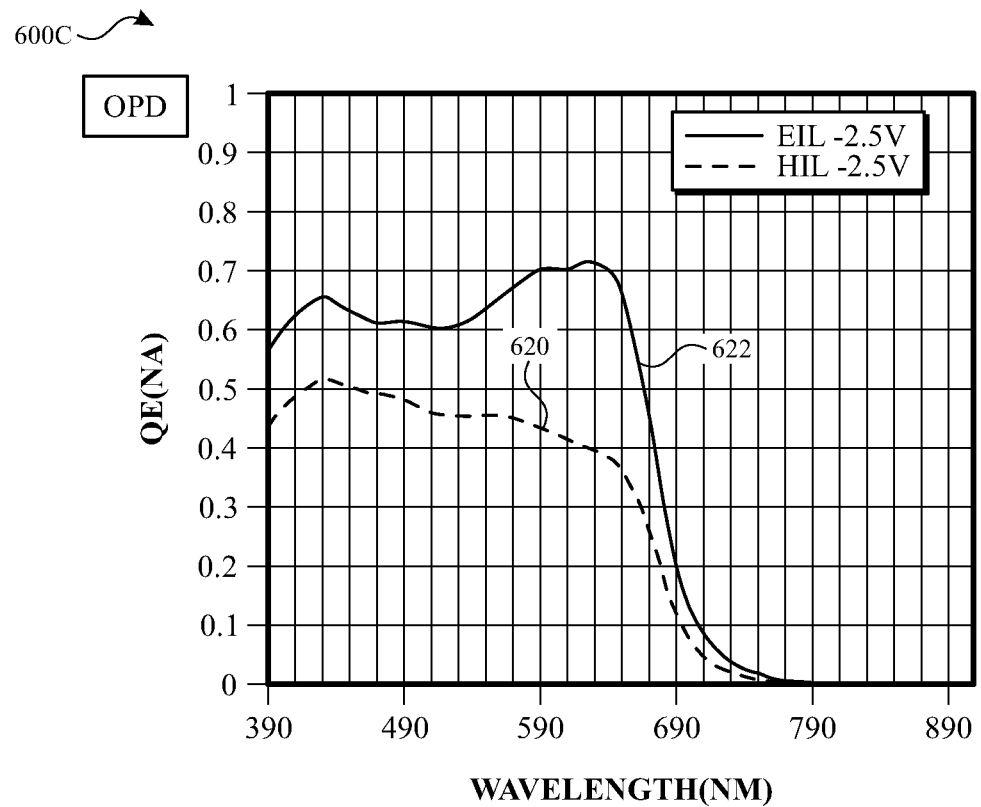

FIGS. 6A, 6B and 6C are charts illustrating plots 600A, 600B and 600C of optical characteristics of example material choices for optical sensors of an optical-sensor-embedded micro-LED display, in accordance with one or more aspects of the subject technology. The chart 600A of FIG. 6A is associated with a micro-LED option for realizing the embedded optical sensors (e.g., 410 of FIGS. 4A, 4B and 4C). The chart 600A includes plots 602, 604 and 606, which, respectively, show variations of quantum efficiency (QE) versus wavelength (in μm) for red, green and blue components of the light. The chart 600A indicated that the micro-LED option achieves the highest QE for the green and blue components. The micro-LED can be used for fingerprint sensing and does not require additional pads to the micro-driver.

The chart 600B of FIG. 6B is associated with a Si photodiode (PD) option for realizing the embedded optical sensors (e.g., 410 of FIGS. 4A, 4B and 4C). The chart 600B includes plots 612, 614 and 616, which, respectively, show variations of QE versus wavelength (in μm) for red, green and blue components of the light. The chart 600B also includes a plot 610, which is a sum plot that adds QEs for the red, green and blue components of the light. The chart 600B indicates that the Si PD option achieves the highest QE for the green and blue components. The Si PDs are easy to integrate with readout integrated circuits to achieve a monolithic solution.

The chart 600C of FIG. 6C is associated with an OPD option for realizing the embedded optical sensors (e.g., 410 of FIGS. 4A, 4B and 4C). The chart 600C includes plots 620 and 622, which, respectively, show variations of QE versus wavelength (in μm) for hole-injection layer (HIL) and electron-injection layer (EIL) options at about −2.5 V. The chart 600C indicates that the OPD option achieves the highest QE for the EIL and can cover a longer wavelength range. The OPD can be implemented in the display panel, although it may be susceptible to degradation if exposed to excessive light and moisture.

In some aspects, a QD or QF photodiode can be used as the optical sensor. These photodiodes are tunable in visible, NIR and SWIR wavelength regions. The issue with these photodiodes, however, is reliability and degradation with exposure to excessive light and moisture and process integration.

Figure 7:
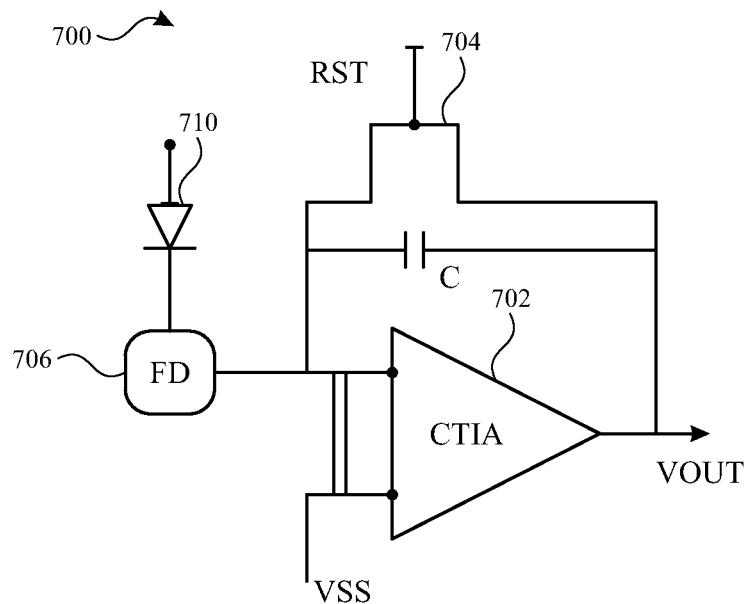
FIG. 7 is a schematic diagram illustrating an example readout circuit for an optical-sensor-embedded micro-LED display of the subject technology.

FIG. 7 is a schematic diagram illustrating an example readout circuit 700 for an optical-sensor-embedded micro-LED display of the subject technology. The readout circuit 700 includes a capacitive transimpedance amplifier (CTIA) 702, a switch 704, a capacitor C and a floating diffusion (FD) storage 706. The FD storage 706, which is used as the sense node for the charge signal, is connected to a cathode terminal of an optical sensor 710 to be readout. The optical sensor 710 is the embedded optical sensor of the subject technology. The CTIA 702 is biased via a voltage source VSS and provides an output voltage signal Vout in response to the current signal of the FD storage 706, which is in turn responsive to the signal from the optical sensor 710.

Figure 8A:
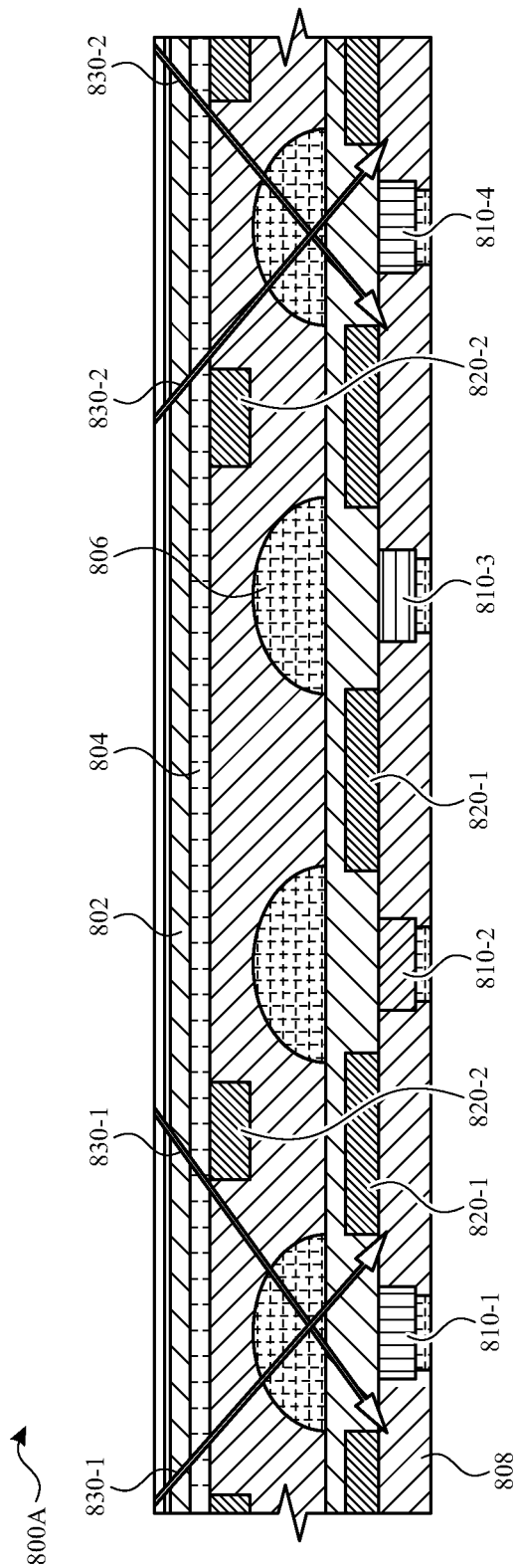
FIGS. 8A, 8B and 8C are schematic diagrams illustrating examples of collimation schemes for an optical-sensor-embedded micro-LED display, in accordance with one or more aspects of the subject technology.
Figure 8B:
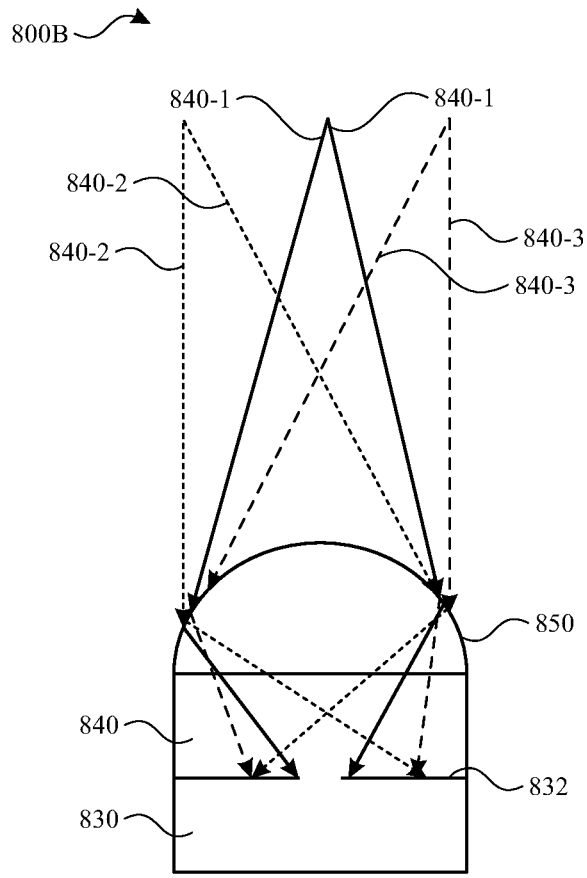
Figure 8C:
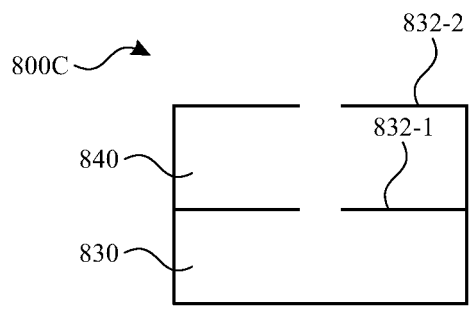

FIGS. 8A, 8B and 8C are schematic diagrams illustrating examples of collimation schemes 800A, 800B and 800C for an optical-sensor-embedded micro-LED display, in accordance with one or more aspects of the subject technology. In the collimation scheme 800A, a micro-LED display 800 is shown that is used for fingerprint sensing, and micro-LEDs are utilized both for pixels and for optical sensing. The micro-LED display 800 includes a cover glass 802, a polarizer layer 804, microlenses 806, a diffuser layer 808, BM layers 820 (820-1 and 820-2) and micro-LEDs 810 (810-1, 810-2, 810-3 and 810-4). The BM layer 820-1 is the lower layer in the micro-LED plane and the BM layer 820-2 is formed under the polarizer layer 804. The function of the BM layers 820 is to collimate the scattered light ray (e.g., 830-1 and 830-2) from different regions of the finger and focus onto the pixel micro-LEDs 810-1 and 810-4, respectively, and then prevent them from reaching the optical sensors 810-2 and 810-3. The BM layer collimators can be used for proximity sensor applications as well.

In the collimation scheme 800B of FIG. 8B, the collimation is provided by a pinhole mask 832, which is created on top of the photodiodes 830, and is covered by a transparent spacer 840 and a microlens 850. The microlens 850 can focus the incident light rays 840-1 onto the pinhole of the pinhole mask 832 and have the incident light rays 840-2 and 840-3 blocked from reaching the pinhole as shown in FIG. 8B.

The collimation scheme 800C of FIG. 8C is similar to the collimation scheme 800B, except that the microlens 850 is replaced with a second pinhole mask 832-2, which can be realized by using a second metal layer and is disposed on top of the transparent spacer 840. The first pinhole mask 832-1 can be realized by a first metal layer and is disposed on the photodiodes 830 and together with the second pinhole mask 832-2 form the collimator.

Figure 9:
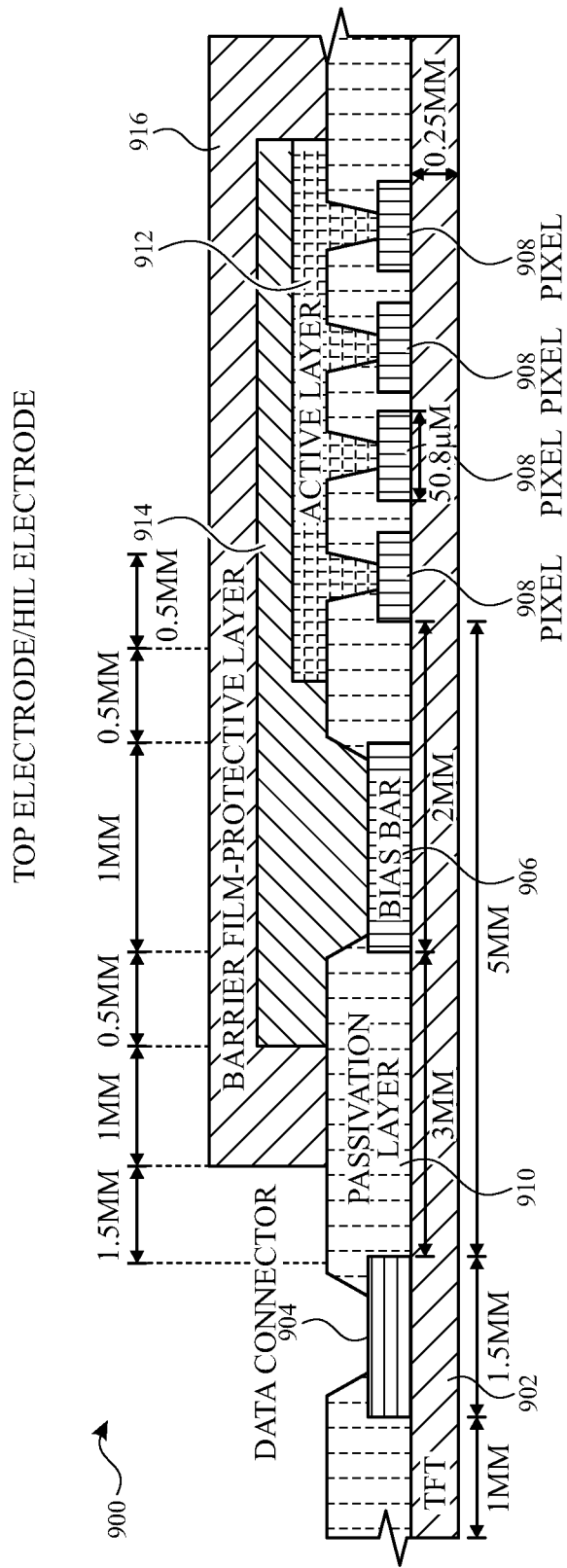
FIG. 9 is a schematic diagram illustrating an example structure of a micro-LED display with embedded organic photodetectors (OPDs), in accordance with one or more aspects of the subject technology.

FIG. 9 is a schematic diagram illustrating an example structure of a micro-LED display 900 with embedded OPDs, in accordance with one or more aspects of the subject technology. The micro-LED display 900 is a thin-film transistor (TFT) based display and includes a TFT layer 902, a data connector layer 904, a bias connector layer 906, pixels 908, a passive layer 910, an active layer 912, a top electrode (HIL electrode) 914 and a protective layer 916. All the dimension values shown in FIG. 9 are exemplary values and may change depending on the process and design. In the micro-LED display 900, the active layer is the light sensing layer, which can be an OPD layer, and is integrated within the micro-LED panel.

Figure 10A:
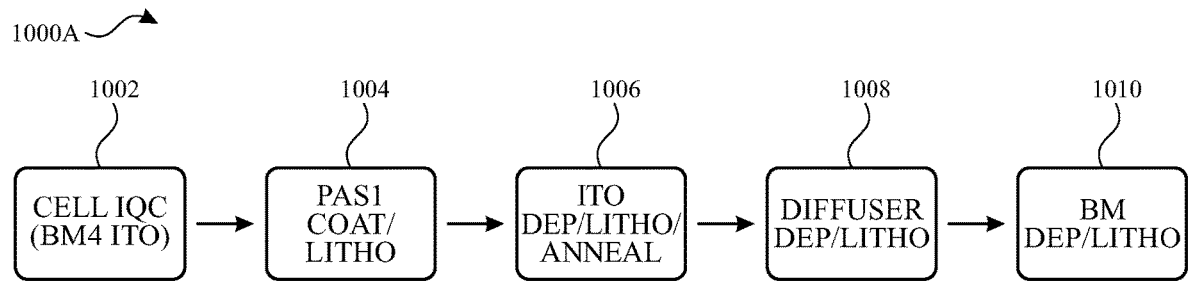
FIGS. 10A and 10B are schematic diagrams illustrating examples of a process for creating a micro-LED display.
Figure 10B:
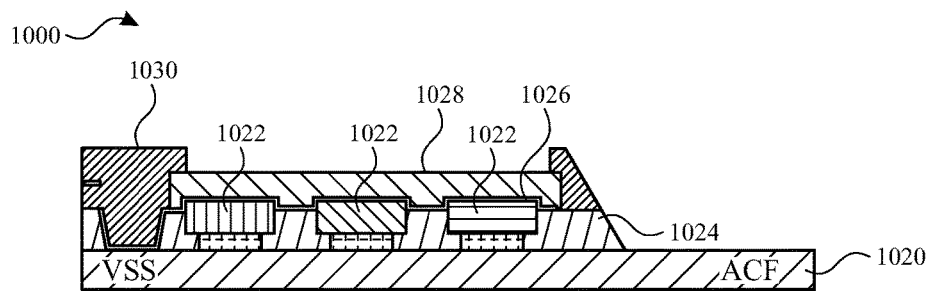

FIGS. 10A and 10B are schematic diagrams illustrating examples of a process 1000A for creating a micro-LED display 1000. The micro-LED display 1000 includes an anisotropic conductive film (ACF) 1020, RGB pixels 1022, a passive layer 1024, an ITO layer 1026, a diffuser layer 1028 and a BM layer 1030. The process 1000A includes steps for creating the micro-LED display 1000 without optical sensors. The process 1000A begins with operational step 1002, which is a BM4 ITO process for creating the ACF layer 1020 and the RGB pixels 1022. In the next process step 1004, the passive layer 1024 is created using a suitable deposition (coating) technique followed by lithography. In process step 1006, the ITO layer 1026 is formed by using a deposition and lithography. In process step 1008, deposition and lithography techniques are used to provide the diffuser layer 1028. Finally at process step 1010, the BM layer 1030 is formed by using a suitable deposition and lithography process.

Figure 11A:
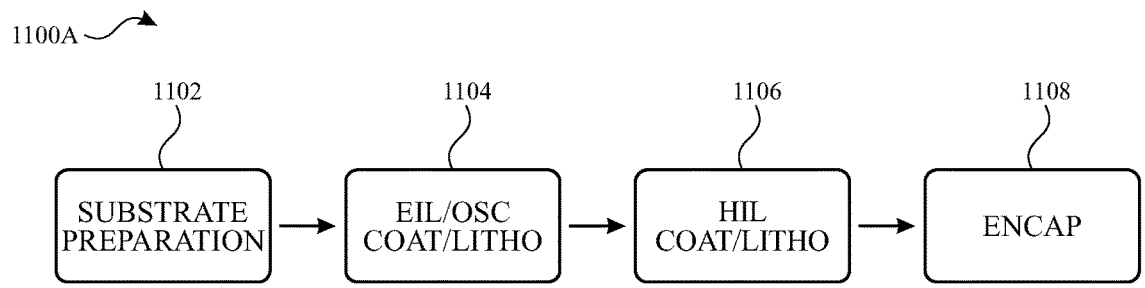
FIGS. 11A and 11B are schematic diagrams illustrating examples of a process for integration of OPD with a micro-LED display, in accordance with one or more aspects of the subject technology.
Figure 11B:
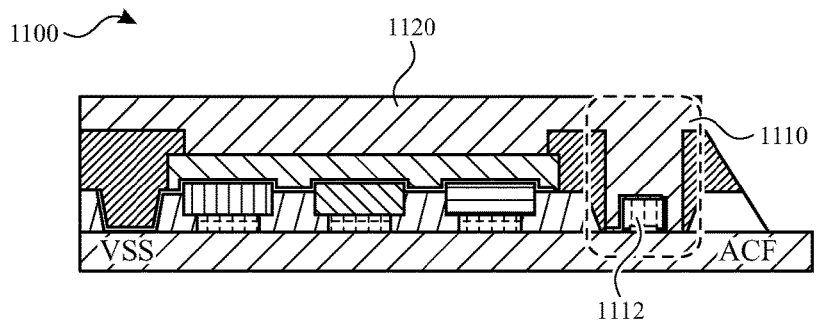
Figure 12A:
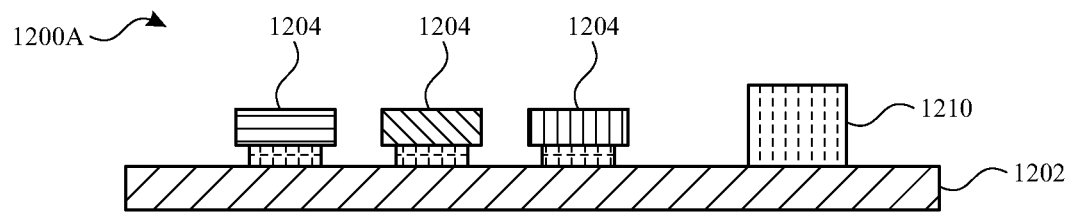
FIGS. 12A, 12B, 12C and 12D are schematic diagrams illustrating examples of different integration options for an optical sensor with a micro-LED display, in accordance with one or more aspects of the subject technology.
Figure 12B:
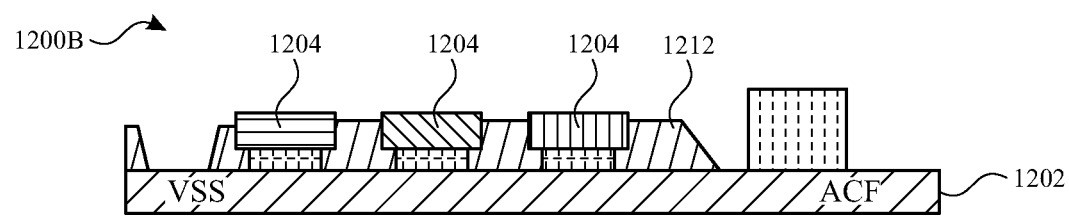
Figure 12C:
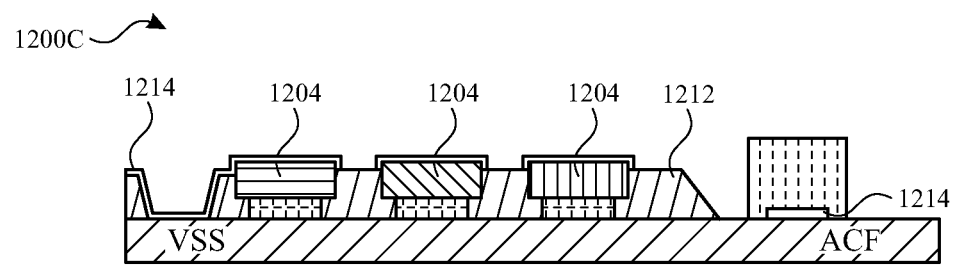
Figure 12D:
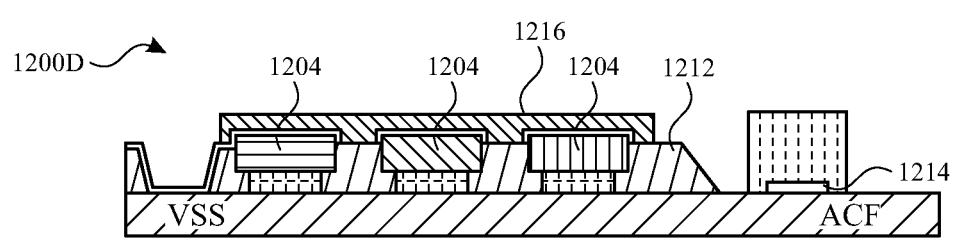

FIGS. 11A and 11B are schematic diagrams illustrating examples of a process 1100A for integration of OPD with a micro-LED display, in accordance with one or more aspects of the subject technology. The process 1100A is the continuation of the process 1000A to prepare an OPD-sensor-embedded micro-LED display 1100, which includes the micro-LED display 1000 of FIG. 10B integrated with an OPD sensor module 1110. The OPD sensor module 1110 includes an OPD sensor 1112 and corresponding EIL and HIL layers. The process 1000A includes process steps 1102, 1104, 1106 and 1108. In process step 1102, the substrate is prepared for formation of the EIL, OPD sensor 1112 and the HIL. In process step 1104, using a suitable deposition technique and lithography, the EIL layer and the OPD sensor 1112 are created. Next, at process step 1106, the HIL layer is coated and patterned. Finally, in process step 1108, the OPD-sensor-embedded micro-LED display 1100 is encapsulated using a passivation layer 1120.

FIGS. 12A, 12B, 12C and 12D are schematic diagrams illustrating examples of different integration options 1200A, 1200B, 1200C and 1200D for an optical sensor with a micro-LED display, in accordance with one or more aspects of the subject technology. In the integration option 1200A shown in FIG. 12A the starting die includes the RGB pixels 1204 and the OPD 1210. In this option the OPD cathode is the BM4 ITO 1202. In the integration option 1200B shown in FIG. 12B the starting die includes the RGB pixels 1204 and the passivation layer 1212, and the OPD 1210 is deposited after coating the passivation layer 1212. In this option the OPD cathode is the BM4 ITO 1202. In the integration option 1200C shown in FIG. 12C the starting die includes the RGB pixels 1204, the passivation layer 1212 and the ITO layer 1214, and the OPD 1210 is deposited after coating the ITO layer 1214. In this option the OPD cathode is the ITO layer 1214. In the integration option 1200D shown in FIG. 12D the starting die includes the RGB pixels 1204, the passivation layer 1212, the ITO layer 1214 and the diffuser layer 1216, and the OPD 1210 is deposited after coating the diffuser layer 1216. In this option the OPD cathode is the ITO layer 1214. Each of these options has their corresponding advantages and disadvantages. Examples of advantages of these options includes the integration option 1200A requires fewer mask layers; the integration option 1200B requires fewer mask layers and the uniformity of the passivation layer 1212 is minimally affected; the integration option 1200C has minimal impact on the display layers and minimal change to the OPD process; and, similarly, the integration option 1200D has minimal impact on the display layers and minimal change to the OPD process.

Figure 13:
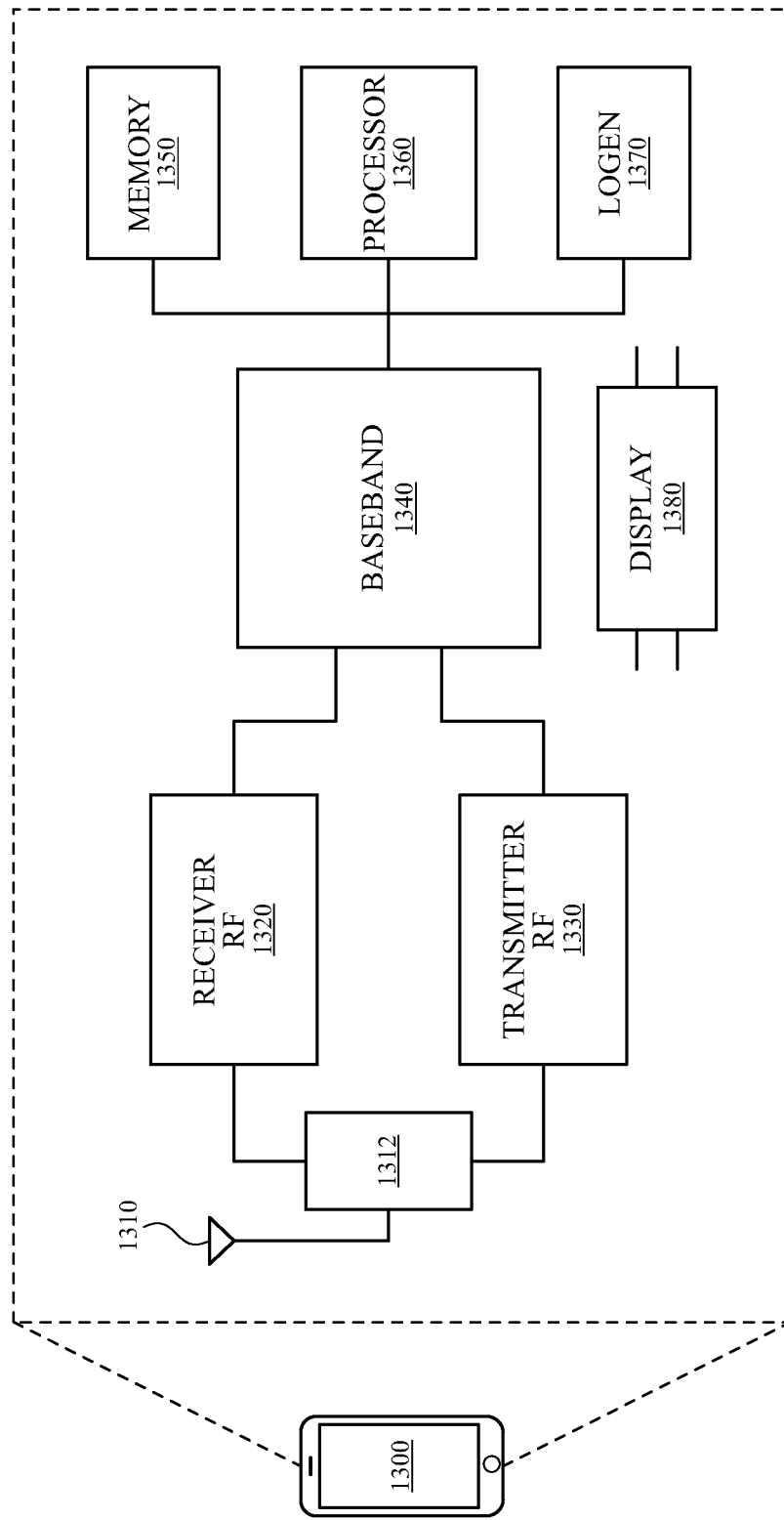
FIG. 13 is a schematic diagram illustrating an example of a wireless communication device in which the optical-sensor-embedded micro-LED display of the subject technology is utilized.

FIG. 13 is a schematic diagram illustrating an example of a wireless communication device 1300 in which the optical-sensor-embedded micro-LED display of the subject technology is utilized. In one or more implementations, the wireless communication device 1300 can be a smartphone or a smartwatch. The wireless communication device 1300 may comprise a radio-frequency (RF) antenna 1310, a duplexer 1312, a receiver 1320, a transmitter 1330, a baseband processing module 1340, a memory 1350, a processor 1360, a local oscillator generator (LOGEN) 1370 and a display 1380. In various embodiments of the subject technology, one or more of the blocks represented in FIG. 13 may be integrated on one or more semiconductor substrates. For example, the blocks 1320-1370 may be realized in a single chip or a single system on a chip, or may be realized in a multichip chipset.

The receiver 1320 may comprise suitable logic circuitry and/or code that may be operable to receive and process signals from the RF antenna 1310. The receiver 1320 may, for example, be operable to amplify and/or down-convert received wireless signals. In various embodiments of the subject technology, the receiver 1320 may be operable to cancel noise in received signals and may be linear over a wide range of frequencies. In this manner, the receiver 1320 may be suitable for receiving signals in accordance with a variety of wireless standards, Wi-Fi, WiMAX, Bluetooth, and various cellular standards. In various embodiments of the subject technology, the receiver 1320 may not require any SAW filters and few or no off-chip discrete components such as large capacitors and inductors.

The transmitter 1330 may comprise suitable logic circuitry and/or code that may be operable to process and transmit signals from the RF antenna 1310. The transmitter 1330 may, for example, be operable to up-convert baseband signals to RF signals and amplify RF signals. In various embodiments of the subject technology, the transmitter 1330 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 1330 may be operable to provide signals for further amplification by one or more power amplifiers.

The duplexer 1312 may provide isolation in the transmit band to avoid saturation of the receiver 1320 or damaging parts of the receiver 1320, and to relax one or more design requirements of the receiver 1320. Furthermore, the duplexer 1312 may attenuate the noise in the receive band. The duplexer may be operable in multiple frequency bands of various wireless standards.

The baseband processing module 1340 may comprise suitable logic, circuitry, interfaces, and/or code that may be operable to perform processing of baseband signals. The baseband processing module 1340 may, for example, analyze received signals and generate control and/or feedback signals for configuring various components of the wireless communication device 1300, such as the receiver 1320. The baseband processing module 1340 may be operable to encode, decode, transcode, modulate, demodulate, encrypt, decrypt, scramble, descramble, and/or otherwise process data in accordance with one or more wireless standards.

The processor 1360 may comprise suitable logic, circuitry, and/or code that may enable processing data and/or controlling operations of the wireless communication device 1300. In this regard, the processor 1360 may be enabled to provide control signals to various other portions of the wireless communication device 1300. The processor 1360 may also control transfers of data between various portions of the wireless communication device 1300. Additionally, the processor 1360 may enable implementation of an operating system or otherwise execute code to manage operations of the wireless communication device 1300.

The memory 1350 may comprise suitable logic, circuitry, and/or code that may enable storage of various types of information such as received data, generated data, code, and/or configuration information. The memory 1350 may comprise, for example, RAM, ROM, flash, and/or magnetic storage. In various embodiments of the subject technology, information stored in the memory 1350 may be utilized for configuring the receiver 1320 and/or the baseband processing module 1340.

The LOGEN 1370 may comprise suitable logic, circuitry, interfaces, and/or code that may be operable to generate one or more oscillating signals of one or more frequencies. The LOGEN 1370 may be operable to generate digital and/or analog signals. In this manner, the LOGEN 1370 may be operable to generate one or more clock signals and/or sinusoidal signals. Characteristics of the oscillating signals, such as the frequency and duty cycle, may be determined based on one or more control signals from, for example, the processor 1360 and/or the baseband processing module 1340.

In operation, the processor 1360 may configure the various components of the wireless communication device 1300 based on a wireless standard according to which it is desired to receive signals. Wireless signals may be received via the RF antenna 1310, amplified, and down-converted by the receiver 1320. The baseband processing module 1340 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 1350, and/or information affecting and/or enabling operation of the wireless communication device 1300. The baseband processing module 1340 may modulate, encode, and perform other processing on audio, video, and/or control signals to be transmitted by the transmitter 1330 in accordance with various wireless standards.

The display 1380 may be the optical-sensor-embedded micro-LED display of the subject technology as described above. The use of the optical-sensor-embedded micro-LED display of the subject technology is not limited to wireless communication devices, and the disclosed display technology can be used in any electronic device having a display such as a laptop computer or other electronic devices.

In one or more implementations, the processor 1360 can process sensor signals from the optical sensors integrated with the micro-LED display of the subject technology, after being converted to digital signals by an analog-to-digital converter (ADC) (e.g., an ADC of the communication device 1300).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neutral gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. A phrase such as "an aspect" may refer to one or more aspects and vice versa. A phrase such as "a configuration" does not imply that such configuration is essential to the subject technology or that such configuration applies to all configurations of the subject technology. A disclosure relating to a configuration may apply to all configurations, or one or more configurations. A phrase such as "a configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A micro-light-emitting diode (LED) display comprising:
    a plurality of micro-LED pixel elements;
    a plurality of optical sensors integrated with the plurality of micro-LED pixel elements;
    a transparent conductor layer disposed over the plurality of micro-LED pixel elements and the plurality of optical sensors; and
    a plurality of collimators, wherein a collimator of the plurality of collimators is formed of one or more pinholes.

2. The micro-LED display of claim 1, wherein a micro-LED pixel element of the plurality of micro-LED pixel elements and an optical sensor of the plurality of optical sensors share a micro-driver circuit that is configured to provide a current for the micro-LED pixel element and bias voltage and readout circuitry for the optical sensor.

3. The micro-LED display of claim 1, further comprising a passivation layer isolating a micro-LED pixel element of the plurality of micro-LED pixel elements from an optical sensor of the plurality of optical sensors.

4. The micro-LED display of claim 1, wherein at least one set of optical sensors of the plurality of optical sensors is disposed in between four blocks of red-green-blue (RGB) pixel elements, wherein each block of RGB pixels includes a set of primary RGB pixel elements and a set of redundant RGB pixel elements.

5. The micro-LED display of claim 1, wherein at least one set of optical sensors of the plurality of optical sensors is disposed on one side of four blocks of RGB pixel elements, wherein each block of RGB pixels includes a set of primary RGB pixel elements and a set of redundant RGB pixel elements.

6. The micro-LED display of claim 1, wherein an optical sensor of the plurality of optical sensors is disposed on one side of a block of RGB pixel elements, wherein the block of RGB pixels includes a set of primary RGB pixel elements and a set of redundant RGB pixel elements.

7. The micro-LED display of claim 1, wherein the plurality of optical sensors are embedded in a micro-LED panel of the micro-LED display, and wherein the micro-LED panel includes the plurality of micro-LED pixel elements.

8. The micro-LED display of claim 1, wherein the plurality of optical sensors are embedded in a micro-driver layer of the micro-LED display, and wherein the micro-driver layer includes a plurality of micro-driver circuits.

9. The micro-LED display of claim 1, wherein the plurality of optical sensors are embedded in a sensor layer of the micro-LED display, and wherein the sensor layer is disposed underneath a micro-driver layer, and wherein the micro-driver layer includes a plurality of micro-driver circuits.

10. The micro-LED display of claim 1, wherein an optical sensor of the plurality of optical sensors is realized using one of a list of options, the list of options including an organic photodiode (OPD), a Si PD, a micro-LED, dedicated silicon-based photodetectors or quantum dot (QD) material.

11. The micro-LED display of claim 1, wherein a pinhole of the one or more pinholes is formed by two black matrix (BM) layers separated by a transparent spacer layer.

12. The micro-LED display of claim 1, wherein a pinhole of the one or more pinholes is formed by a pinhole mask layer and a microlens separated from the pinhole mask layer by a transparent spacer layer.

13. An electronic device comprising:
a processor; and
a micro-LED display comprising:
  a plurality of micro-LED pixel elements;
  a plurality of optical sensors integrated with the plurality of micro-LED pixel elements;
  a transparent conductor layer disposed over the plurality of micro-LED pixel elements and the plurality of optical sensors; and
  a readout circuit controlled by the processor and configured to read out the plurality of optical sensors; and
a plurality of collimators, wherein a collimator of the plurality of collimators is formed of one or more pinholes.

14. The electronic device of claim 13, wherein at least one set of optical sensors of the plurality of optical sensors is disposed in between or on one side of four blocks of RGB pixel elements.

15. The electronic device of claim 13, wherein an optical sensor of the plurality of optical sensors is implemented using one of a list of options, the list of options including an OPD, a Si PD, a micro-LED, dedicated silicon-based photodetector or QD material.

16. The electronic device of claim 13, wherein the plurality of optical sensors are embedded in a micro-LED panel or in a micro-driver layer of the micro-LED display, and wherein the micro-LED panel includes the plurality of micro-LED pixel elements, and the micro-driver layer includes a plurality of micro-driver circuits.

17. The electronic device of claim 13, wherein the plurality of optical sensors are embedded in a sensor layer underneath a micro-driver layer, and wherein the micro-driver layer includes a plurality of micro-driver circuits.

18. The electronic device of claim 13, wherein a pinhole of the one or more pinholes is formed by two BM layers separated by a transparent spacer layer or a pinhole mask layer and a microlens separated from the pinhole mask layer by a transparent spacer layer.

19. A display apparatus comprising:
a display panel;
a micro-LED panel including a plurality of micro-LED pixel elements;
a micro-driver layer including a plurality of driver circuits; and
a plurality of optical sensors embedded in one of the micro-LED panel or micro-driver layer, wherein at least one set of optical sensors of the plurality of optical sensors is disposed in between or on one side of four blocks of RGB pixel elements.

20. The display apparatus of claim 19, wherein an optical sensor of the plurality of optical sensors is implemented using one of a list of options, the list of options including an OPD, a Si PD, a micro-LED or QD material.

21. The display apparatus of claim 19, wherein at least some of the micro-LED pixel elements are configured to be used as photodetectors.

* * * * *